(12) United States Patent
Ishibashi

(10) Patent No.: US 11,081,373 B2
(45) Date of Patent: Aug. 3, 2021

(54) SUBSTRATE CLEANING APPARATUS AND SUBSTRATE CLEANING METHOD

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 48 days.

(21) Appl. No.: 15/689,071

(22) Filed: Aug. 29, 2017

(65) Prior Publication Data

US 2018/0068877 A1   Mar. 8, 2018

(30) Foreign Application Priority Data

Sep. 2, 2016 (JP) ............................. JP2016-171398

(51) Int. Cl.
*H01L 21/67* (2006.01)
*H01L 21/687* (2006.01)
*B08B 3/02* (2006.01)

(52) U.S. Cl.
CPC ........ *H01L 21/67051* (2013.01); *B08B 3/024* (2013.01); *H01L 21/67046* (2013.01); *H01L 21/68728* (2013.01)

(58) Field of Classification Search
CPC .................... H01L 21/67046; H01L 21/67051
See application file for complete search history.

(56) References Cited

U.S. PATENT DOCUMENTS

| 2007/0028950 A1 | 2/2007 | Egashira et al. | |
|---|---|---|---|
| 2008/0251101 A1* | 10/2008 | Ohno | B08B 3/02 134/4 |
| 2014/0083468 A1* | 3/2014 | Miyazaki | H01L 21/67051 134/82 |
| 2014/0158159 A1* | 6/2014 | Ishibashi | H01L 21/67046 134/6 |
| 2015/0034121 A1 | 2/2015 | Ishibashi | |
| 2015/0348806 A1 | 12/2015 | Ishibashi | |

FOREIGN PATENT DOCUMENTS

| JP | 2013/162044 A | 8/2013 |
|---|---|---|
| JP | 2014/132641 A | 7/2014 |
| JP | 2015-201627 A | 11/2015 |
| KR | 10-2014-0073429 A | 6/2014 |
| KR | 10-2015-0004751 A | 1/2015 |

OTHER PUBLICATIONS

Japan Patent Office, Notice of Reasons for Refusal for Japanese Patent Application No. 2016-171398 (dated Dec. 6, 2019).
Singapore Patent Office, Search Report for Singapore Patent Application No. 10201707070R (dated Mar. 24, 2020).
Korean Patent Office, Notification of Reason for Refusal for Korean Patent Application No. 10-2017-0109955 (dated Jul. 15, 2020).

* cited by examiner

*Primary Examiner* — David G Cormier
(74) *Attorney, Agent, or Firm* — Leydig, Voit & Mayer, Ltd.

(57) ABSTRACT

According to one embodiment, a substrate cleaning apparatus that cleans a substrate while rotating the substrate, the substrate cleaning apparatus includes: a first cleaning liquid supplier that sprays cleaning liquid in a spray shape at a first spraying angle toward a center of the substrate; and a second cleaning liquid supplier that sprays cleaning liquid in a spray shape at a second spraying angle greater than the first spraying angle toward an area between the center of the substrate and an edge of the substrate.

12 Claims, 7 Drawing Sheets

SUBSTRATE CLEANING APPARATUS AND SUBSTRATE CLEANING METHOD

CROSS-REFERENCE TO RELATED APPLICATIONS

This application claims the benefit of Japanese Priority Patent Application JP 2016-171398 filed on Sep. 2, 2016, the entire contents of which are incorporated herein by reference.

FIELD

The present technique relates to a substrate cleaning apparatus and a substrate cleaning method.

BACKGROUND

A substrate cleaning apparatus that rotates and cleans a substrate such as a semiconductor wafer while supplying cleaning liquid to the substrate is known (for example, JP 2015-201627A). However, the recent technological advancement necessitates higher cleanness of processed wafer, resulting in that sufficient detergency might be not necessarily obtained in some cases.

It is desired to provide a substrate cleaning apparatus and a substrate cleaning method which have higher detergency.

SUMMARY OF THE INVENTION

According to one embodiment, a substrate cleaning apparatus that cleans a substrate while rotating the substrate, the substrate cleaning apparatus includes: a first cleaning liquid supplier that sprays cleaning liquid in a spray shape at a first spraying angle toward a center of the substrate; and a second cleaning liquid supplier that sprays cleaning liquid in a spray shape at a second spraying angle greater than the first spraying angle toward an area between the center of the substrate and an edge of the substrate.

According to another embodiment, a substrate cleaning method includes, while spraying cleaning liquid in a spray shape at a first spraying angle toward a center of a rotating substrate, spraying cleaning liquid in a spray shape at a second spraying angle greater than the first spraying angle toward an area between the center of the substrate and an edge of the substrate.

DETAILED DESCRIPTION OF NON-LIMITING EXAMPLE EMBODIMENTS

Figure 1:
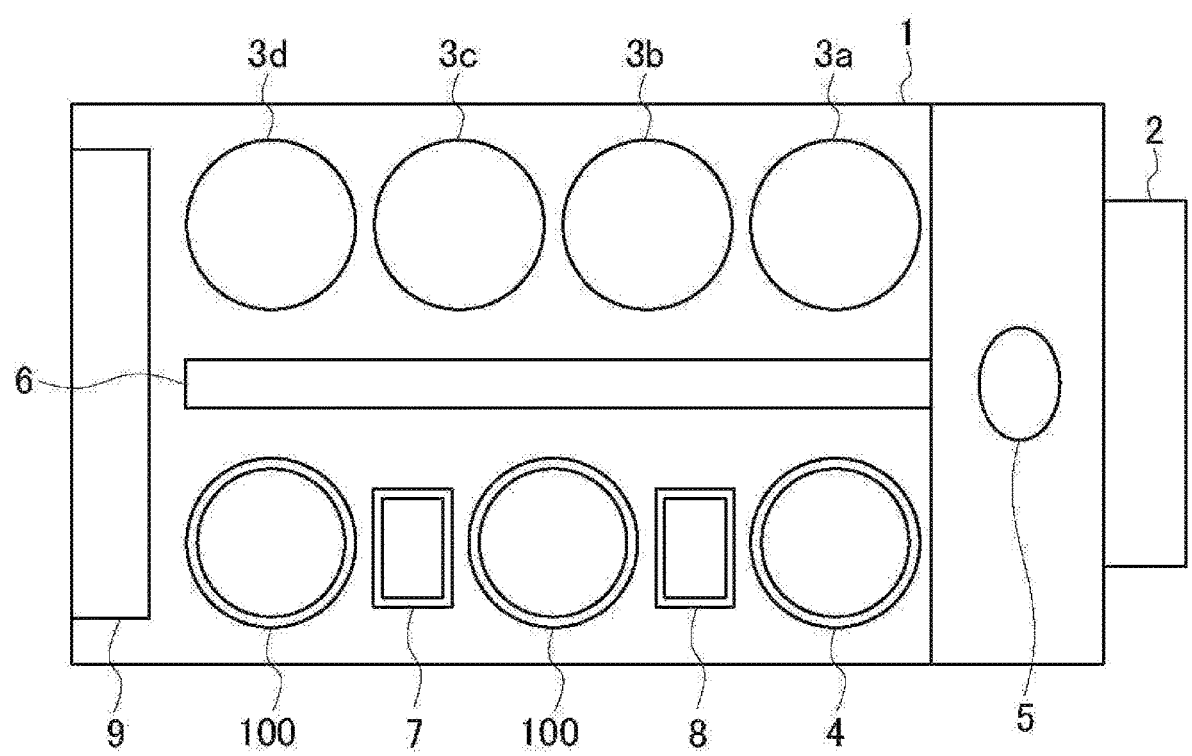
FIG. 1 is a plan view showing an entire configuration of a substrate processing apparatus including a substrate cleaning apparatus according to an embodiment.

Hereinafter, an embodiment will be described. The embodiment described below shows an example of a case in which the present technique is implemented and the embodiment does not limit the present technique to a concrete configuration described below. When implementing the present technique, any concrete configuration according to the embodiment may be appropriately employed.

According to one embodiment, provided is a substrate cleaning apparatus that cleans a substrate while rotating the substrate, the substrate cleaning apparatus including: a first cleaning liquid supplier that sprays cleaning liquid in a spray shape at a first spraying angle toward a center of the substrate; and a second cleaning liquid supplier that sprays cleaning liquid in a spray shape at a second spraying angle greater than the first spraying angle toward an area between the center of the substrate and an edge of the substrate.

The centrifugal force around the center of the substrate is small, so that the cleaning liquid from the first cleaning liquid supplier is returned onto the substrate by the rotation of the substrate. Therefore, an area around the center of the substrate can be efficiently cleaned and the detergency is improved. Further, the cleaning liquid is sprayed in a spray shape, so that it is possible to reduce a load to the substrate.

Preferably, a line that connects the first cleaning liquid supplier and a center of an arrival area of the cleaning liquid sprayed from the first cleaning liquid supplier is substantially perpendicular to a longitudinal direction of the arrival area, and a line that connects the second cleaning liquid supplier and a center of an arrival area of the cleaning liquid sprayed from the second cleaning liquid supplier is substantially perpendicular to a longitudinal direction of the arrival area.

The cleaning liquid from the second cleaning liquid supplier is used for the cleaning and then blown off to the outside of the substrate by the centrifugal force, so that the used cleaning liquid does not remain on the substrate. Therefore, the cleaning liquid that has been used for the cleaning does not remain on the substrate and the detergency is improved.

Preferably, the substrate cleaning apparatus further includes a cleaner that comes into contact with the substrate and cleans the substrate.

Preferably, the first cleaning liquid supplier and the second cleaning liquid supplier spray cleaning liquid in a direction substantially perpendicular to a longitudinal direction of the cleaner.

The cleaning liquid from the second cleaning liquid supplier is used for the cleaning and then blown off to the outside of the substrate by the centrifugal force, so that the used cleaning liquid does not remain on the substrate. Therefore, the cleaning liquid that has been used for the cleaning does not remain on the substrate and the detergency is improved.

Preferably, the first cleaning liquid supplier and/or the second cleaning liquid supplier includes a first nozzle that sprays pure water and a second nozzle that sprays chemical liquid, and the chemical liquid sprayed from the second nozzle reaches closer to the cleaner than the pure water sprayed from the first nozzle.

The chemical liquid reaches close to the cleaner, so that the substrate can be efficiently cleaned by the cleaner.

Preferably, the first cleaning liquid supplier and/or the second cleaning liquid supplier includes a first nozzle that sprays pure water and a second nozzle that sprays chemical liquid, and the first nozzle is located closer to a plane including the substrate W than the second nozzle.

By arranging the first nozzle and the second nozzle in this way, the chemical liquid reaches close to the cleaner. Therefore, the substrate can be efficiently cleaned by the cleaner.

Preferably, the first cleaning liquid supplier and the second cleaning liquid supplier spray cleaning liquid to an upper surface of the substrate, and a spraying direction of the first cleaning liquid supplier is identical to a spraying direction of the second cleaning liquid supplier.

If the spraying directions are opposite to each other on the upper surface of the substrate, the cleaning liquid from the first cleaning liquid supplier and the cleaning liquid from the second cleaning liquid supplier collide with each other and fly up, so that contaminated cleaning liquid may land on the substrate. The phenomenon described above can be prevented by equalizing the spraying directions as described above.

Preferably, the first cleaning liquid supplier and the second cleaning liquid supplier spray cleaning liquid to a lower surface of the substrate, and a spraying direction of the first cleaning liquid supplier is opposite to a spraying direction of the second cleaning liquid supplier.

On the lower surface of the substrate, the spraying direction of the first cleaning liquid supplier and the spraying direction of the second cleaning liquid supplier are opposite to each other, so that both cleaning liquid suppliers can be respectively arranged at positions facing each other. Therefore, it is possible to downsize the substrate cleaning apparatus.

Preferably, the second cleaning liquid supplier sprays cleaning liquid in a direction identical to a rotation direction of the substrate.

The relative speed between the substrate and the cleaning liquid becomes small, so that a time in which the cleaning liquid is on the substrate becomes long and the detergency is improved.

Preferably, the substrate cleaning apparatus further including: a roll-shaped cleaner that comes into contact with the substrate while being rotated and cleans the substrate, wherein the second cleaning liquid supplier sprays cleaning liquid to an area, where the substrate and the cleaner contact with each other and rotation directions of the substrate and the cleaner coincide with each other, in a direction identical to the rotation directions.

The relative speed between the cleaner and the cleaning liquid also becomes small, so that a time in which the cleaning liquid is in contact with the cleaner becomes long and the detergency is improved.

Preferably, an amount of cleaning liquid sprayed by the second cleaning liquid supplier is greater than an amount of cleaning liquid sprayed by the first cleaning liquid supplier.

As described above, regarding the cleaning liquid from the second cleaning liquid supplier, the relative speed with the substrate and the relative speed with the cleaner are small, so that there is no time that is used for the cleaning. Therefore, the amount of cleaning liquid sprayed by the second cleaning liquid supplier should be large.

Preferably, the first cleaning liquid supplier includes: a first pure water nozzle that sprays pure water supplied from a first pure water supply pipe, and a first chemical liquid nozzle that sprays chemical liquid supplied from a first chemical liquid supply pipe, the second cleaning liquid supplier includes: a second pure water nozzle that sprays pure water supplied from a second pure water supply pipe different from the first pure water supply pipe, and a second chemical liquid nozzle that sprays chemical liquid supplied from a second chemical liquid supply pipe different from the first chemical liquid supply pipe, the first pure water supply pipe and the second pure water supply pipe respectively have flow rate adjusting functions different from each other, and the first chemical liquid supply pipe and the second chemical liquid supply pipe respectively have flow rate adjusting functions different from each other.

The pure water supplies from the first pure water nozzle and the second pure water nozzle do not interfere each other, so that the spray pressure is stabilized. Similarly, the chemical liquid supplies from the first chemical liquid nozzle and the second chemical liquid nozzle do not interfere each other, so that the spray pressure is stabilized.

Preferably, the first cleaning liquid supplier and the second cleaning liquid supplier substantially uniformly spray cleaning liquid.

The cleaning liquid is uniformly sprayed, so that it is possible to suppress generation of pH distribution on the substrate even when the cleaning liquid is acidic or alkaline.

According to another aspect, provided is a substrate cleaning method including, while spraying cleaning liquid in a spray shape at a first spraying angle toward a center of a rotating substrate, spraying cleaning liquid in a spray shape at a second spraying angle greater than the first spraying angle toward an area between the center of the substrate and an edge of the substrate.

Hereinafter, the embodiment will be described in detail with reference to the drawings.

FIG. 1 is a plan view showing an entire configuration of a substrate processing apparatus including a substrate cleaning apparatus 100 according to the embodiment. As shown in FIG. 1, the substrate processing apparatus includes a substantially rectangular housing 1 and a load port 2 where a substrate cassette that stocks many substrates such as semiconductor wafers is mounted.

The load port 2 is arranged adjacent to the housing 1. It is possible to mount an open cassette, an SMIF (Standard Manufacturing Interface) pod, or an FOUP (Front Opening Unified Pod) on the load port 2. The SMIF pod and the FOUP are sealed containers that can maintain an environment independent from the external space by housing the substrate cassette inside thereof and covering the substrate cassette with partition walls.

Inside the housing 1, one or a plurality of (in this example, four) substrate polishing apparatuses 3a to 3d, one or a plurality of (in this example, two) substrate cleaning apparatuses 100, and a substrate drying apparatus 4 that dries a substrate that has been cleaned are housed. The substrate polishing apparatuses 3a to 3d are arranged along a longitudinal direction of the substrate processing apparatus and the substrate cleaning apparatuses 100 and the substrate drying apparatus 4 are also arranged along the longitudinal direction of the substrate processing apparatus. The substrate polishing apparatuses 3a to 3d may polish a surface of a substrate or may polish a bevel.

A transport unit 5 is arranged in an area surrounded by the load port 2, the substrate polishing apparatus 3a located close to the load port 2, and the substrate drying apparatus 4. A transport unit 6 is arranged in parallel with the substrate polishing apparatuses 3a to 3d. The transport unit 5 receives a substrate before polishing from the load port 2 and transfers the substrate to the transport unit 6. Further, the transport unit 5 receives the substrate after drying from the substrate drying apparatus 4.

A transport unit 7 that transfers the substrate between the substrate cleaning apparatuses 100 is arranged between the substrate cleaning apparatuses 100. A transport unit 8 that transfers the substrate between the substrate cleaning apparatus 100 and the substrate drying apparatus 4 is arranged between the substrate cleaning apparatus 100 close to the substrate drying apparatus 4 and the substrate drying apparatus 4. Further, a controller 9 that controls operation of each device of the substrate processing apparatus is arranged inside the housing 1.

Figure 2:
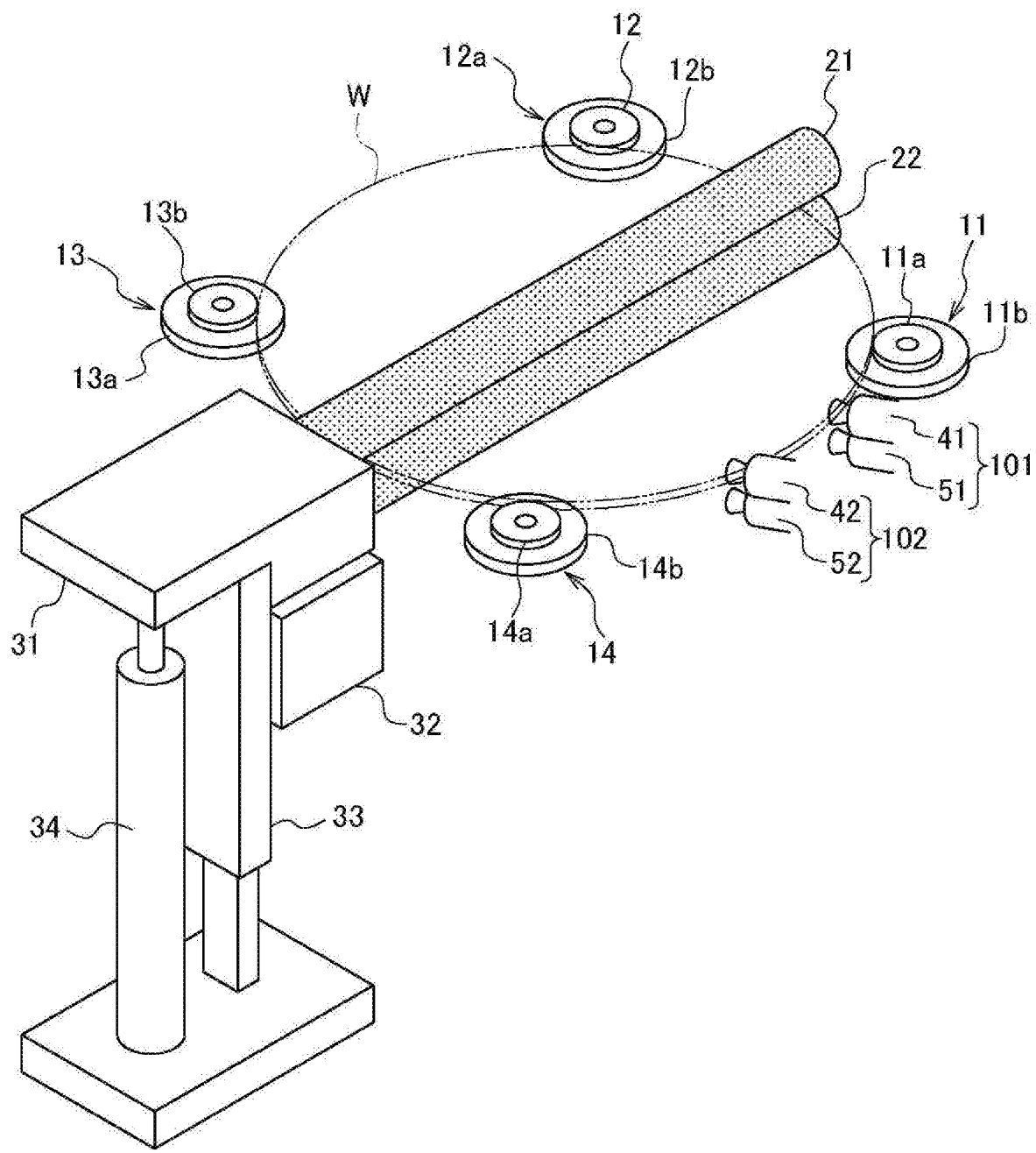
FIG. 2 is a perspective view showing the substrate cleaning apparatus according to the embodiment.

FIG. 2 is a perspective view showing the substrate cleaning apparatus 100 according to the embodiment. The substrate cleaning apparatus 100 includes four rollers 11 to 14 arranged on substantially the same horizontal plane, two columnar roll sponges 21 and 22 which are cleaners, rotation mechanisms 31 and 32 that rotate the roll sponges 21 and 22, respectively, pure water supply nozzles 41 to 44, and chemical liquid supply nozzles 51 to 54.

The substrate cleaning apparatuses 100 are isolated from each other by a partition wall or the like, and the cleaning liquid and the like are kept inside so as not to leak to the outside during a process of cleaning the substrate. The partition wall may be provided with a shutter mechanism for loading and unloading the substrate to and from the substrate cleaning apparatuses 100.

The roller 11 has a two-stage structure including a holding module 11a and a shoulder module (support module) 11b. The diameter of the shoulder module 11b is greater than that of the holding module 11a. The holding module 11a is provided on the shoulder module 11b. The rollers 12 to 14 have the same structure as that of the roller 11. The rollers 11 to 14 can be moved in a direction in which the rollers 11 to 14 come close to and go away from each other by a drive mechanism (for example, an air cylinder) not shown in the drawings. When the rollers 11 to 14 come close to each other, the holding modules 11a to 14a can substantially horizontally hold the substrate W. At least one of the rollers 11 to 14 is driven and rotated by a rotation mechanism not shown in the drawings, and thereby the substrate W can be rotated in a horizontal plane.

The roll sponge 21 extends in the horizontal plane, comes into contact with an upper surface of the substrate W held by the rollers 11 to 14, and cleans the upper surface of the substrate W. The roll sponge 21 is rotated around an axis in the longitudinal direction of the roll sponge 21 by the rotation mechanism 31. The rotation mechanism 31 is attached to a guide rail 33 that guides the rotation mechanism 31 to move in a vertical direction. The rotation mechanism 31 is supported by a lift drive mechanism 34. The rotation mechanism 31 and the roll sponge 21 are moved in the vertical direction along the guide rail 33 by the lift drive mechanism 34.

The roll sponge 22 extends in the horizontal plane, comes into contact with a lower surface of the substrate W held by the rollers 11 to 14, and cleans the lower surface of the substrate W. The roll sponge 22 is arranged below the roll sponge 21 and is rotated around an axis in the longitudinal direction of the roll sponge 22 by the rotation mechanism 32. Although a lift drive mechanism and the like are omitted in the drawings, in the same manner as the roll sponge 21, the rotation mechanism 32 and the roll sponge 22 are also moved in the vertical direction.

The pure water supply nozzles 41 and 42 are located obliquely above the substrate W and supply pure water to the upper surface of the substrate W. The chemical liquid supply nozzles 51 and 52 are located obliquely above the substrate W and supply chemical liquid to the upper surface of the substrate W. In the description below, the chemical liquid and the pure water are collectively referred to as cleaning liquid. Not only the chemical liquid but also the pure water is used, so that it is possible to increase the amount of liquid and reduce cost. A set of the pure water supply nozzle 41 and the chemical liquid supply nozzle 51 is referred to as a cleaning liquid supplier 101, and a set of the pure water supply nozzle 42 and the chemical liquid supply nozzle 52 is referred to as a cleaning liquid supplier 102.

Although not shown in FIG. 2, as described later with reference to FIG. 4, the pure water supply nozzles 43 and 44 are located obliquely below the substrate W and supply pure water to the lower surface of the substrate W. The chemical liquid supply nozzles 53 and 54 are located obliquely below the substrate W and supply chemical liquid to the lower surface of the substrate W. A set of the pure water supply nozzle 43 and the chemical liquid supply nozzle 53 is referred to as a cleaning liquid supplier 103, and a set of the pure water supply nozzle 44 and the chemical liquid supply nozzle 54 is referred to as a cleaning liquid supplier 104.

One of features of the embodiment is a method for supplying the cleaning liquid, and this feature will be described later in detail.

The substrate cleaning apparatus 100 cleans the substrate W by operating as described below. When the substrate W is loaded, the roller 11 to 14 are located at positions away from each other. Further, the roll sponge 21 has risen and the roll sponge 22 has fallen.

The substrate W transported by a transport unit not shown in the drawings is first mounted on the shoulder modules 11b to 14b of the rollers 11 to 14. Thereafter, the rollers 11 to 14 move in a direction approaching each other, that is, a direction approaching the substrate W, so that the substrate W is substantially horizontally held by the holding modules 11a to 14a.

Next, the roll sponge 21 falls and comes into contact with the upper surface of the substrate W, and the roll sponge 22 rises and comes into contact with the lower surface of the substrate W. Desirably, the roll sponge 22 is located immediately below the roll sponge 21, and a region including the center of the substrate W comes into contact with the roll sponges 21 and 22. The cleaning liquid suppliers 101 to 104 supply cleaning liquid to the substrate W.

Then, the substrate W is rotated in the horizontal plane by the rollers 11 to 14 and the roll sponges 21 and 22 come into contact with the upper and the lower surfaces, respectively, of the substrate W while rotating around each of their shaft centers, so that the upper and the lower surfaces of the substrate W are scrub-cleaned. After the scrub-cleaning, the roll sponge 21 rises, the roll sponge 22 falls, and the substrate W is unloaded from the substrate cleaning apparatus 100 by a transport unit not shown in the drawings.

In a state in which the roll sponges 21 and 22 are not in contact with the substrate W, it is also possible to clean the substrate W by the cleaning liquid from the cleaning liquid suppliers 101 to 104. The substrate W may be cleaned by the cleaning liquid without using the roll sponges 21 and 22.

Next, a supplying form of the cleaning liquid will be described in detail. While a plurality of features related to supply of the cleaning liquid will be described, the substrate cleaning apparatus 100 according to the embodiment only has to have at least one of the features.

Figure 3:
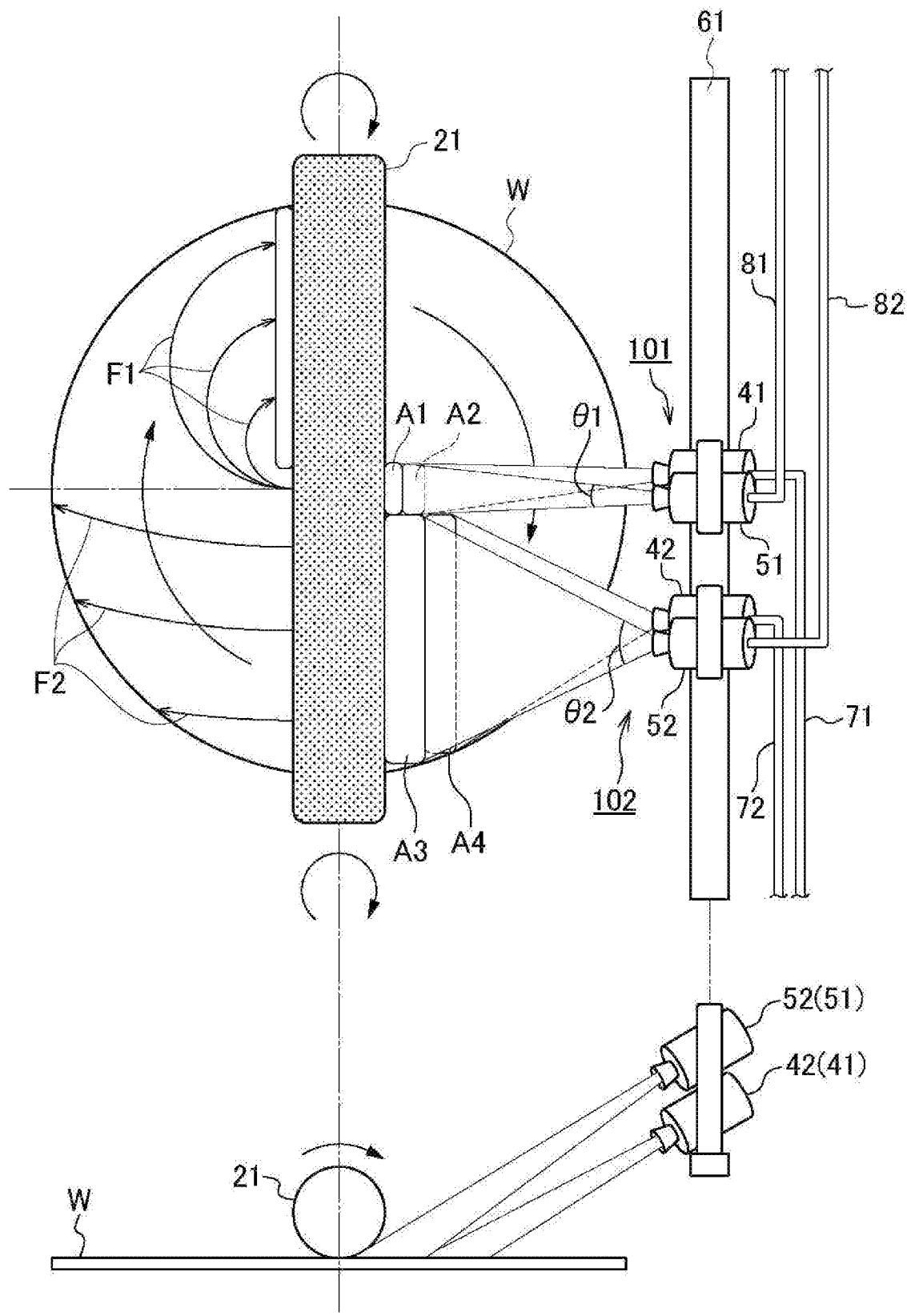
FIG. 3 is a schematic top view and a schematic side view of the substrate cleaning apparatus of FIG. 2.

FIG. 3 is a schematic top view and a schematic side view of the substrate cleaning apparatus 100 of FIG. 2. In FIG. 3, it is assumed that the substrate W rotates in a clockwise direction as seen from the front side of the page (from above the substrate W) in the schematic top view and the roll sponge 21 rotates in a clockwise direction as seen from the front side of the page in the schematic side view. Therefore, in a contact area between a lower side of the roll sponge 21 on the page and the substrate W, rotation directions of the roll sponge 21 and the substrate W coincide with each other. On the other hand, in a contact area between an upper side of the roll sponge 21 on the page and the substrate W, rotation directions of the roll sponge 21 and the substrate W are opposite to each other.

The cleaning liquid suppliers 101 and 102 are supported by a support member 61 extending substantially in parallel with the longitudinal direction of the roll sponge 21. It is desirable that pure water is supplied to the pure water supply nozzles 41 and 42 from separate pure water supply pipes 71 and 72, respectively. Specifically, it is desirable that the pure water supply nozzle 41 has a flow rate adjusting function different from that of the pure water supply nozzle 42. This is because when a pure water supply pipe common to the pure water supply nozzles 41 and 42 is provided, a spray pressure may be unstable. Because of the same reason, it is desirable that chemical liquid is supplied to the chemical liquid supply nozzles 51 and 52 from separate chemical liquid supply pipes 81 and 82, respectively. Specifically, it is desirable that the chemical liquid supply nozzle 51 has a flow rate adjusting function different from that of the chemical liquid supply nozzle 52.

The chemical liquid supply nozzle 51 is arranged above the pure water supply nozzle 41. In other words, the pure water supply nozzle 41 is arranged closer to the horizontal plane including the substrate W than the chemical liquid supply nozzle 51. A spraying direction of the cleaning liquid of the cleaning liquid supplier 101 including the pure water supply nozzle 41 and the chemical liquid supply nozzle 51 is substantially perpendicular to the longitudinal direction of the roll sponge 21 and faces the center of the substrate W.

The cleaning liquid supplier 101 faces the center of the substrate W with a relatively small spraying angle θ1 and sprays the cleaning liquid in a spray shape in a direction substantially perpendicular to the longitudinal direction of the roll sponge 21. The sprayed chemical liquid reaches a small area A1 including an area in front of the center of the substrate W and the pure water reaches a small area A2 in front of the area A1 (for convenience, an area closer to the cleaning liquid supplier 101 than the roll sponge 21 is called "front" and an area farther than the roll sponge 21 is called "rear").

In other words, the cleaning liquid supplier 101 sprays the cleaning liquid to an area on the substrate W between the center of the substrate W and the cleaning liquid supplier 101 itself. More specifically, the chemical liquid supply nozzle 51 sprays the chemical liquid to the area A1 somewhat in front of the center of the substrate W, and the pure water supply nozzle 41 sprays the pure water to the area A2 in front of the area A1.

As described above, the area A1 to which the chemical liquid reaches is closer to the roll sponge 21 than the area A2 to which the pure water reaches. When the area A1 and the area A2 are in a positional relationship as described above, the chemical liquid supply nozzle 51 need not necessarily be arranged above the pure water supply nozzle 41. It is desirable that the chemical liquid (the pure water) uniformly reaches the area A1 (the area A2). This is because even when the chemical liquid is acidic or alkaline, it is possible to suppress deviation in pH distribution on the substrate W.

The chemical liquid supply nozzle 52 is arranged above the pure water supply nozzle 42. In other words, the pure water supply nozzle 42 is arranged closer to the horizontal plane including the substrate W than the chemical liquid supply nozzle 52. A spraying direction of the cleaning liquid of the cleaning liquid supplier 102 including the pure water supply nozzle 42 and the chemical liquid supply nozzle 52 is substantially perpendicular to the longitudinal direction of the roll sponge 21 and faces an area around a central portion between the center and the edge of the substrate W.

The cleaning liquid supplier 102 faces an area between the center and the edge of the substrate W with a relatively large spraying angle 62 and sprays the cleaning liquid in a spray shape in a direction substantially perpendicular to the longitudinal direction of the roll sponge 21 and in the same direction as the rotation direction of the substrate W. The sprayed chemical liquid reaches a large area A3 in front of the area between the center and the edge of the substrate W and the pure water reaches a large area A4 in front of the area A3.

In other words, the cleaning liquid supplier 102 sprays the cleaning liquid to an area on the substrate W between an area between a position near and outside the center of the substrate W and the edge of the substrate W and the cleaning liquid supplier 102 itself. More specifically, the chemical liquid supply nozzle 52 sprays the chemical liquid to the area A3 somewhat in front of the area between the position near and outside the center of the substrate W and the edge of the substrate W, and the pure water supply nozzle 42 sprays the pure water to the area A4 in front of the area A3.

As described above, the area A3 to which the chemical liquid reaches is closer to the roll sponge 21 than the area A4 to which the pure water reaches. When the area A3 and the area A4 are in a positional relationship as described above, the chemical liquid supply nozzle 52 need not necessarily be arranged above the pure water supply nozzle 42. It is desirable that the chemical liquid (the pure water) uniformly reaches the area A3 (the area A4). The areas A1 to A4 need not be perfectly separated from each other and may partially overlap each other.

As compared with supplying the cleaning liquid from a single pipe nozzle, in the embodiment, the cleaning liquid is sprayed in a spray shape, so that it is possible to suppress the power of the cleaning liquid and reduce the load to the substrate W. The chemical liquid reaches closer to the roll sponge 21 than the pure water, so that the detergency of the roll sponge 21 is improved.

When the cleaning liquid from the cleaning liquid supplier 101 passes between the roll sponge 21 and the substrate W, a contact area between the substrate W and the roll sponge 21 in an area close to the area A1 (an area close to the center of the upper surface of the substrate W) is cleaned. Thereafter, the cleaning liquid enters the rear of the roll sponge 21. A centrifugal force around the center of the substrate W is not so strong, so that the cleaning liquid is returned to the roll sponge 21 along with the rotation of the substrate W (see arrows F1 in FIG. 3). Thereby, the rear of the upper surface of the substrate W is also cleaned by the roll sponge 21.

On the other hand, when the cleaning liquid from the cleaning liquid supplier 102 passes between the roll sponge 21 and the substrate W, a contact area between the substrate W and the roll sponge 21 in an area close to the area A3 (a portion between a position near and outside the center and the edge on the upper surface of the substrate W) is cleaned. Here, in an area close to the area A3, the rotation direction of the substrate W, the rotation direction of the roll sponge 21, and the spraying direction of the cleaning liquid from the cleaning liquid supplier 102 coincide with each other. Therefore, relative speeds of these become small and a time in which the cleaning liquid is in contact with the substrate W and the roll sponge 21 becomes long, so that the detergency increases.

In this way, the time in which the cleaning liquid from the cleaning liquid supplier 102 is in contact with the substrate W and the roll sponge 21 is long, so that it is effective to increase the amount of cleaning liquid sprayed from the cleaning liquid supplier 102 to greater than (for example, about one to two times) the amount of cleaning liquid sprayed from the cleaning liquid supplier 101.

Thereafter, the cleaning liquid enters the rear of the roll sponge 21. The spraying direction of the cleaning liquid is perpendicular to the roll sponge 21, and the rotation direction of the substrate W and the spraying direction of the cleaning liquid coincide with each other, so that the cleaning liquid is blown off to the outside of the substrate W by the centrifugal force (see arrows F2 in FIG. 3) without being forced back to the inside of the substrate W. Thereby, it is possible to prevent the cleaning liquid after being used for long time cleaning from staying on the substrate W.

Here, on the upper surface of the substrate W, it is desirable that the spraying direction from the cleaning liquid supplier 101 and the spraying direction from the cleaning liquid supplier 102 coincide with each other. In FIG. 3, both of the cleaning liquid suppliers 101 and 102 are arranged on the right side of the roll sponge 21 in the page, and the spraying directions of both of the cleaning liquid suppliers 101 and 102 are from right to left in the page. If the spraying directions are opposite to each other, when the cleaning liquid from the cleaning liquid supplier 101 and the cleaning liquid from the cleaning liquid supplier 102 collide with each other, convection is generated and the cleaning liquid flies up. Then, the cleaning liquid, which flies up and thereby contains dust and the like from the air, lands on the substrate W, so that there is a risk that the substrate W is contaminated.

Next, the cleaning liquid suppliers 103 and 104 that supply cleaning liquid to the lower surface of the substrate W will be described. The cleaning liquid suppliers 103 and 104 are substantially the same as the cleaning liquid suppliers 101 and 102 except for supplying cleaning liquid to the lower surface of the substrate W and the point described below.

Figure 4:
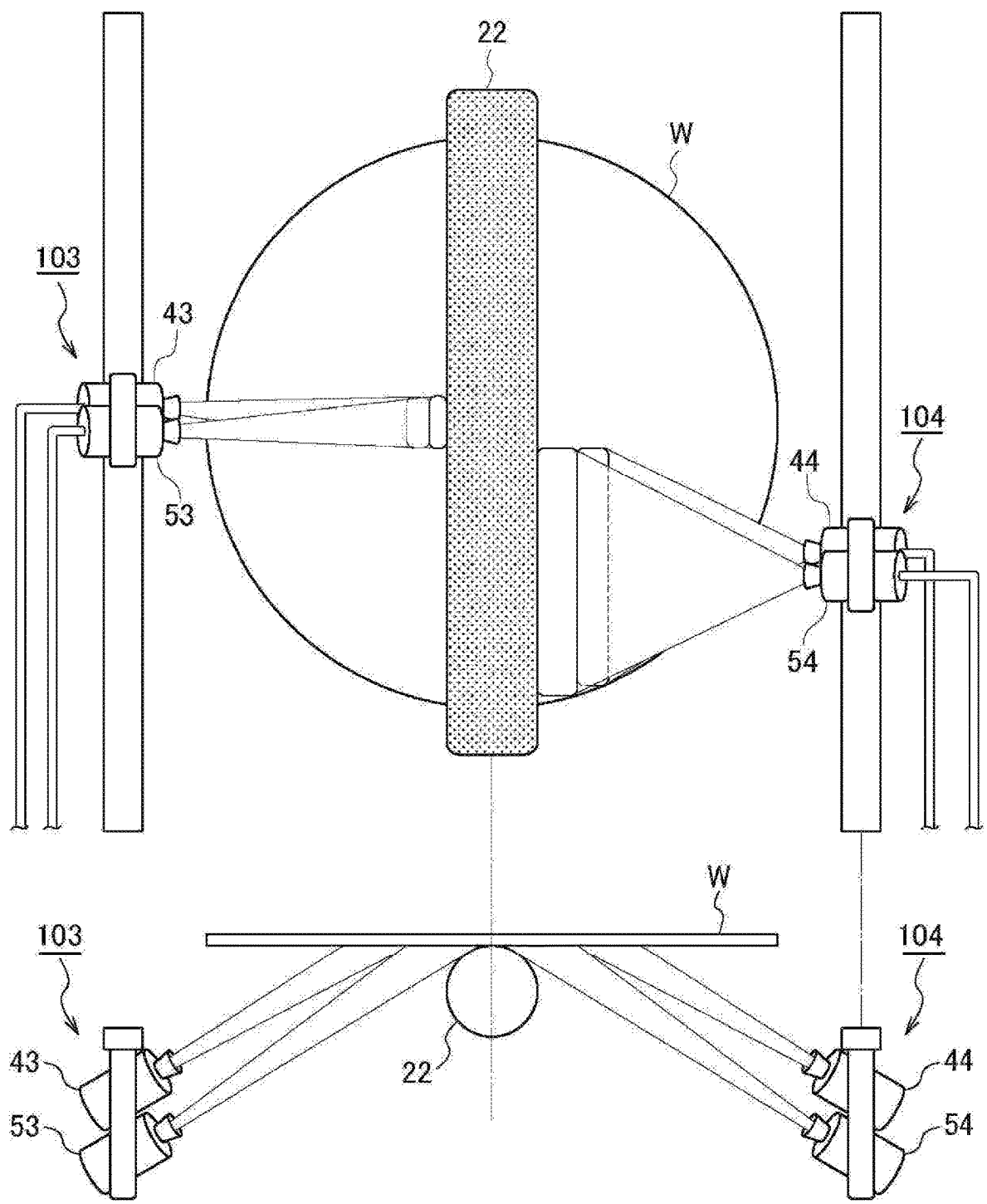
FIG. 4 is a schematic bottom view and a schematic side view of the substrate cleaning apparatus of FIG. 2.

FIG. 4 is a schematic bottom view and a schematic side view of the substrate cleaning apparatus 100 of FIG. 2. In the example in FIG. 4, in the lower surface of the substrate W, the cleaning liquid supplier 103 is arranged on the left side of the roll sponge 22 in the page, and the cleaning liquid supplier 104 is arranged on the right side of the roll sponge 22 in the page. It is desirable that the cleaning liquid supplier 103 and the cleaning liquid supplier 104 are arranged at positions facing each other across the roll sponge 22 (in other words, the center of the substrate W) in this way. This is because the arrangement described above can downsize the substrate cleaning apparatus 100.

In this case, the spraying direction from the cleaning liquid supplier 103 is opposite to the spraying direction from the cleaning liquid supplier 104. More specifically, while the spraying direction from the cleaning liquid supplier 103 is from left to right in the page, the spraying direction from the cleaning liquid supplier 104 is from right to left in the page. However, this is not a problem, because on the lower surface of the substrate W, even when the cleaning liquid from the cleaning liquid supplier 103 and the cleaning liquid from the cleaning liquid supplier 104 collide with each other, the cleaning liquid falls by gravity, so that the cleaning liquid rarely lands on the substrate W. Of course, when the size of the substrate cleaning apparatus 100 is not cared, the cleaning liquid suppliers 103 and 104 may be arranged on the same side with respect to the roll sponge 22.

By the way, when the roll sponges 21 and 22 are provided, the cleaning liquid is sprayed substantially perpendicularly to the longitudinal direction of the roll sponges 21 and 22 as described above. On the other hand, when the roll sponges 21 and 22 are not provided, the cleaning liquid is sprayed in a manner as described below.

Figure 5:
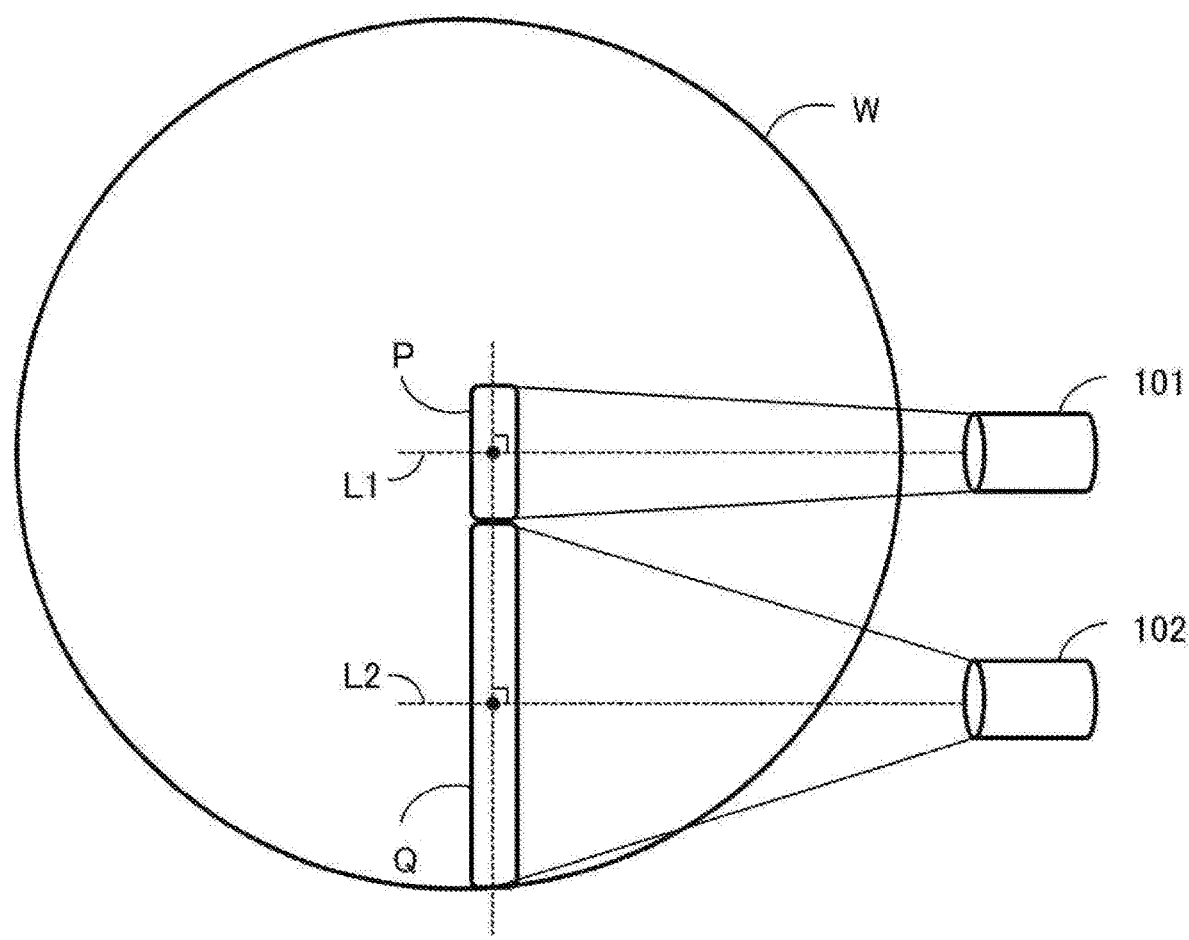
FIG. 5 is a schematic diagram for explaining spraying directions of cleaning liquid suppliers.

FIG. 5 is a schematic diagram for explaining the spraying directions of the cleaning liquid suppliers 101 and 102. In FIG. 5, the cleaning liquids sprayed from the cleaning liquid suppliers 101 and 102 reach areas P (corresponding to the areas A1 and A2 in FIG. 3) and Q (corresponding to the areas A3 and A4 in FIG. 3), respectively, in the substrate W. In this case, the cleaning liquid supplier 101 may spray the cleaning liquid so that a line L1 that connects the cleaning liquid supplier 101 and the center of the area P is perpendicular to the longitudinal direction of the area P. Similarly, the cleaning liquid supplier 102 may spray the cleaning liquid so that a line L2 that connects the cleaning liquid supplier 102 and the center of the area Q is perpendicular to the longitudinal direction of the area Q.

The substrate cleaning apparatus 100 described above cleans the substrate W by holding the substrate W in a substantially horizontal direction. However, the substrate cleaning apparatus 100 may clean the substrate W by obliquely holding the substrate W or holding the substrate W in a vertical direction.

Figure 6A:
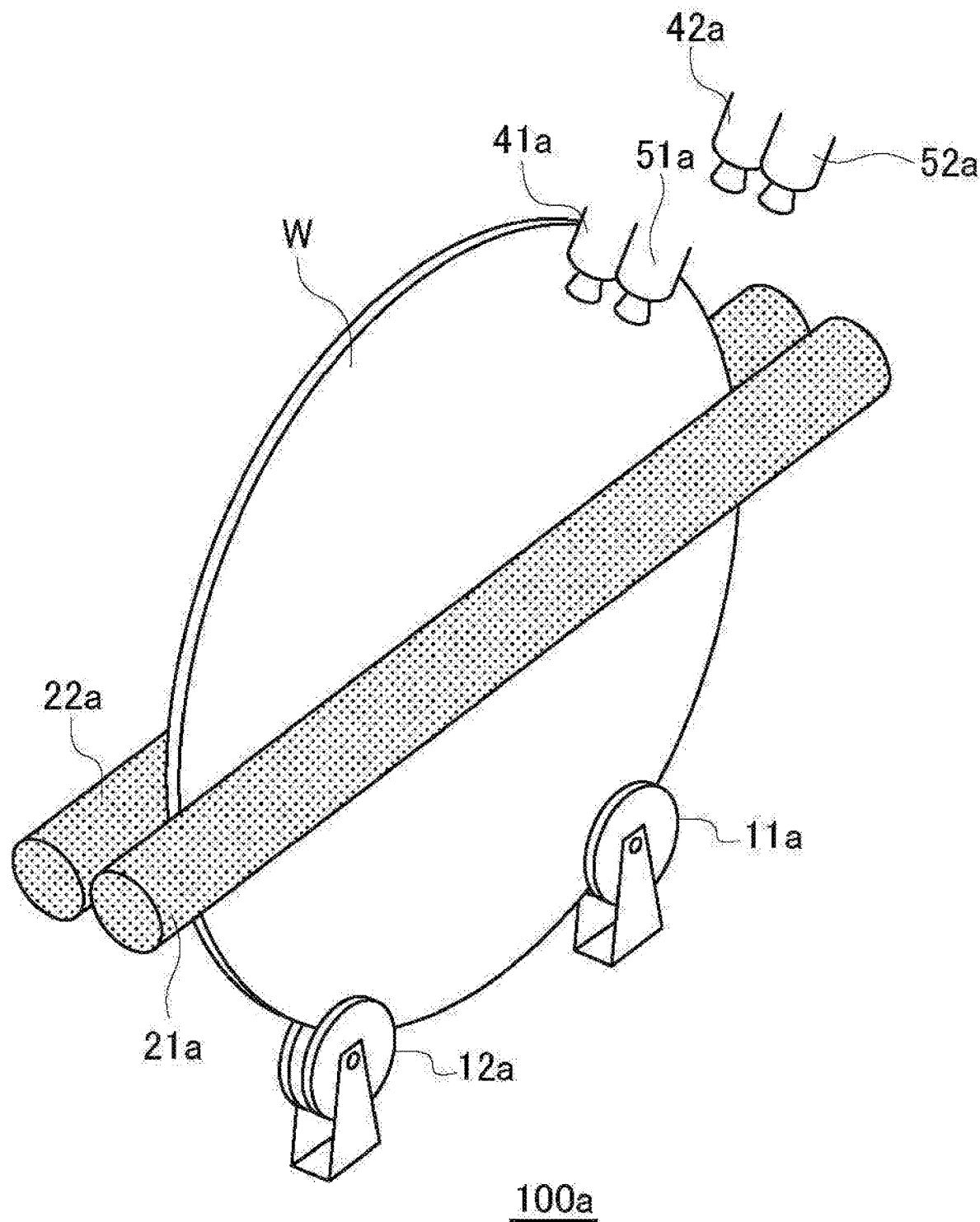
FIG. 6A is a schematic perspective view of a substrate cleaning apparatus that holds a substrate in a vertical direction and cleans the substrate.
Figure 6B:
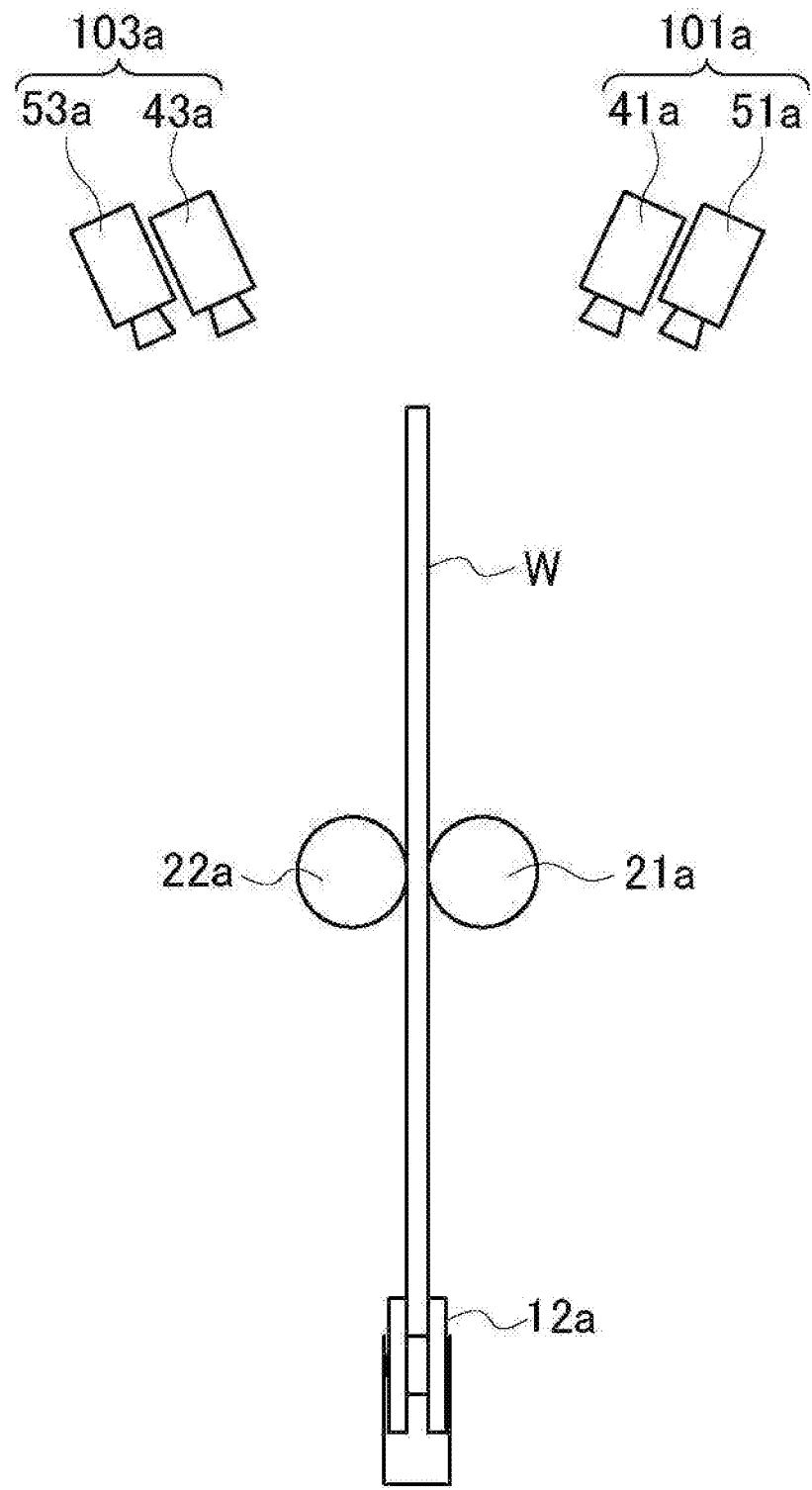
FIG. 6B is a schematic side view of the substrate cleaning apparatus that holds the substrate in the vertical direction and cleans the substrate.

FIGS. 6A and 6B are, respectively, a schematic perspective view and a schematic side view of a substrate cleaning apparatus 100a that holds the substrate W in the vertical direction and cleans the substrate W. In FIGS. 6A and 6B, "a" is added to the end of code of each corresponding component in FIGS. 2 to 4.

The substrate cleaning apparatus 100a holds the substrate W in the vertical direction by two rollers 11a and 12a. Further, the substrate W is sandwiched by two roll sponges 21a and 22a which face each other and extend in the same horizontal plane. Specifically, the roll sponge 21a comes into contact with a first surface of the substrate W and cleans the first surface and the roll sponge 22a comes into contact with a second surface of the substrate W and cleans the second surface.

A cleaning liquid supplier 101a is arranged above the center of the substrate W. A pure water supply nozzle 41a of the cleaning liquid supplier 101a is arranged closer to a vertical plane including the substrate W than a chemical liquid supply nozzle 51a. A cleaning liquid supplier 102a is arranged shifted from the cleaning liquid supplier 101a. A pure water supply nozzle 42a of the cleaning liquid supplier 102a is arranged closer to the vertical plane including the substrate W than a chemical liquid supply nozzle 52a. In the same manner as the cleaning liquid suppliers 101 and 102 supply the cleaning liquid to the upper surface of the substrate W in FIG. 3, the cleaning liquid suppliers 101a and 102a in FIGS. 6A and 6B supply the cleaning liquid to the first surface of the substrate W.

Although not shown in the drawings, two cleaning liquid suppliers (corresponding to the cleaning liquid suppliers 103 and 104 in FIG. 3) that supply cleaning liquid to the second surface of the substrate W are provided. Others are the same as those in FIG. 3.

Further, in the embodiment, for example, a liquid discharge port (not shown in the drawings) that is communicated with a vacuum source and sucks cleaning waste liquid is provided to the rollers 11a and 12a in FIG. 6A, the cleaning waste liquid is discharged from the liquid discharge ports during cleaning, and the waste liquid may be guided to, for example, a gas-liquid separation tank not shown in the drawings. Alternatively, another roller 13a is arranged between the rollers 11a and 12a in FIG. 6A, the liquid discharge port is provided to only the roller 13a, the cleaning waste liquid is discharged from the liquid discharge port during cleaning, and the waste liquid may be guided to, for example, a gas-liquid separation tank not shown in the drawings. By these configurations, it is possible to prevent residues in the waste liquid from remaining in the rollers and the like and more smoothly discharge the residues in the waste liquid to the outside.

As described above, in the embodiment, the cleaning liquid is sprayed from the cleaning liquid supplier 101 toward the center of the substrate. The centrifugal force around the center of the substrate is small, so that the cleaning liquid passes under the roll sponge 21 and thereafter is returned onto the substrate by the rotation of the substrate. Therefore, it is possible to efficiently clean an area around the center of the substrate.

The above embodiment is described so that a person with an ordinary skill in the technical field to which the invention pertains can implement the invention. Various modified examples of the above embodiment can be naturally made by those skilled in the art, and the technical idea of the invention can be applied to other embodiments. Therefore, the invention is not limited to the described embodiment and should encompass the widest range in accordance with the technical ideas defined by the claims.

What is claimed is:

1. A substrate cleaning apparatus that cleans a substrate while rotating the substrate, the substrate cleaning apparatus comprising:
    a first cleaning liquid supplier that sprays cleaning liquid in a spray shape at a first spraying angle toward a center of the substrate;
    a second cleaning liquid supplier that sprays cleaning liquid in a spray shape at a second spraying angle greater than the first spraying angle toward an area between the center of the substrate and an edge of the substrate, and
    a cleaner that comes into contact with the substrate and cleans the substrate, wherein
    a body of the first cleaning liquid supplier and a body of the second cleaning liquid supplier are parallel such that when viewed from a position above the substrate and the cleaner, a first line is parallel to a second line, wherein the first line connects the first cleaning liquid supplier and a center of a first arrival area of the cleaning liquid sprayed from the first cleaning liquid supplier, the second line connects the second cleaning liquid supplier and a center of a second arrival area of the cleaning liquid sprayed from the second cleaning liquid supplier, and the first line and the second line being substantially perpendicular to a longitudinal direction of the cleaner, and
    the second cleaning liquid supplier sprays cleaning liquid to an area, where the substrate and the cleaner contact with each other where rotational surfaces of the substrate and the cleaner are tangential to each other with respect to the cleaner, each having a corresponding rotational axis orthogonal to each other, and in the second arrival area, a horizontal component of a spraying direction from the second cleaning liquid supplier has an identical direction to a direction of a moving point on the rotational surface of the substrate, and
    wherein the first cleaning liquid supplier and the second cleaning liquid supplier spray cleaning liquid such that the second arrival area is larger than the first arrival area.

2. The substrate cleaning apparatus according to claim 1, wherein
    the first line that connects is substantially perpendicular to a longitudinal direction of the first arrival area, and
    the second line is substantially perpendicular to a longitudinal direction of the second arrival area.

3. The substrate cleaning apparatus according to claim 1, wherein the first cleaning liquid supplier and the second cleaning liquid supplier spray cleaning liquid in a direction substantially perpendicular to the longitudinal direction of the cleaner.

4. The substrate cleaning apparatus according to claim 1, wherein
    the first cleaning liquid supplier and/or the second cleaning liquid supplier comprises a first nozzle that sprays pure water and a second nozzle that sprays chemical liquid, and
    the chemical liquid sprayed from the second nozzle reaches closer to the cleaner than the pure water sprayed from the first nozzle.

5. The substrate cleaning apparatus according to claim 1, wherein
    the first cleaning liquid supplier and/or the second cleaning liquid supplier comprises a first nozzle that sprays pure water and a second nozzle that sprays chemical liquid, and
    the first nozzle is located closer to a plane including the substrate W than the second nozzle.

6. The substrate cleaning apparatus according to claim 1, wherein
    the first cleaning liquid supplier and the second cleaning liquid supplier spray cleaning liquid to an upper surface of the substrate, and
    the spraying direction of the first cleaning liquid supplier is identical to the spraying direction of the second cleaning liquid supplier.

7. The substrate cleaning apparatus according to claim 1, wherein
    the first cleaning liquid supplier and the second cleaning liquid supplier spray cleaning liquid to a lower surface of the substrate, and
    the spraying direction of the first cleaning liquid supplier is opposite to the spraying direction of the second cleaning liquid supplier.

8. The substrate cleaning apparatus according to claim 1, wherein an amount of cleaning liquid sprayed by the second cleaning liquid supplier is greater than an amount of cleaning liquid sprayed by the first cleaning liquid supplier.

9. The substrate cleaning apparatus according to claim 1, wherein
    the first cleaning liquid supplier comprises:
        a first pure water nozzle that sprays pure water supplied from a first pure water supply pipe, and
        a first chemical liquid nozzle that sprays chemical liquid supplied from a first chemical liquid supply pipe,
    the second cleaning liquid supplier comprises:
        a second pure water nozzle that sprays pure water supplied from a second pure water supply pipe different from the first pure water supply pipe, and a second chemical liquid nozzle that sprays chemical liquid supplied from a second chemical liquid supply pipe different from the first chemical liquid supply pipe, the first pure water supply pipe and the second pure water supply pipe respectively have flow rate adjusting functions different from each other, and the first chemical liquid supply pipe and the second chemical liquid supply pipe respectively have flow rate adjusting functions different from each other.

10. The substrate cleaning apparatus according to claim 1, wherein the first cleaning liquid supplier and the second cleaning liquid supplier substantially uniformly spray cleaning liquid.

11. The substrate cleaning apparatus according to claim 1, wherein the substrate cleaning apparatus is further configured to rotate the cleaner around a shaft center, and wherein a spraying direction from the second cleaning liquid supplier has an identical direction to a direction of a moving point on the rotational surface of the cleaner.

12. The substrate cleaning apparatus according to claim 1, wherein the substrate cleaning apparatus further comprises a plurality of rollers configured to rotate the substrate in the horizontal plane while cleaning the substrate.

* * * * *